(12) United States Patent
You et al.

(10) Patent No.: US 9,947,734 B2
(45) Date of Patent: Apr. 17, 2018

(54) ORGANIC LIGHT EMITTING DISPLAY DEVICE

(71) Applicant: Samsung Display Co., LTD., Yongin-si, Gyeonggi-Do (KR)

(72) Inventors: Chun-Gi You, Asan-si (KR); Gwang-Geun Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/379,202

(22) Filed: Dec. 14, 2016

(65) Prior Publication Data

US 2017/0186827 A1  Jun. 29, 2017

(30) Foreign Application Priority Data

Dec. 29, 2015  (KR) .......................... 10-2015-0188254

(51) Int. Cl.
*H01L 27/32* (2006.01)
*H01L 27/12* (2006.01)
*H01L 51/52* (2006.01)

(52) U.S. Cl.
CPC ...... *H01L 27/3258* (2013.01); *H01L 27/1248* (2013.01); *H01L 27/326* (2013.01); *H01L 27/3246* (2013.01); *H01L 51/525* (2013.01)

(58) Field of Classification Search
None
See application file for complete search history.

(56) References Cited

U.S. PATENT DOCUMENTS

| | | | |
|---|---|---|---|
| 8,890,317 B1 * | 11/2014 | Koo | H01L 51/5228 257/40 |
| 8,916,859 B2 * | 12/2014 | Kim | H01L 51/102 257/40 |
| 9,034,673 B2 * | 5/2015 | Rohatgi | H01L 51/524 438/27 |
| 9,577,215 B2 * | 2/2017 | Hong | H01L 51/5246 |
| 9,583,549 B2 * | 2/2017 | You | H01L 27/3276 |
| 2012/0319141 A1 * | 12/2012 | Kim | H01L 51/525 257/88 |
| 2015/0090982 A1 * | 4/2015 | Lin | H01L 51/525 257/40 |

FOREIGN PATENT DOCUMENTS

KR  10-2014-0095488 A  8/2014

* cited by examiner

*Primary Examiner* — Michelle Mandala
(74) *Attorney, Agent, or Firm* — Innovation Counsel LLP (57) ABSTRACT

A display device may include a substrate, a first light emitting structure, a second light emitting structure, and a support structure. The first light emitting structure may include an electrode and a light emitting layer. A face of the electrode may directly contact the light emitting layer and may overlap the substrate. The support structure may be positioned between the first light emitting structure and the second light emitting structure, may be spaced from each of the first light emitting structure and the second light emitting structure, may overlap a transparent portion of the substrate, and may not include or directly contact any light emitting layer. A height of the support structure relative to the substrate may be greater than at least one of a height of the face of the electrode relative to the substrate and a height of the light emitting layer relative to the substrate.

20 Claims, 9 Drawing Sheets

ORGANIC LIGHT EMITTING DISPLAY DEVICE

CROSS-REFERENCE TO RELATED APPLICATION(S)

This application claims priority under 35 USC § 119 to Korean Patent Application No. 10-2015-0188254 filed on Dec. 29, 2015 in the Korean Intellectual Property Office (KIPO); the contents of the Korean Patent Application are incorporated herein by reference in their entirety.

BACKGROUND

1. Field

The technical field is related to display device, e.g., organic light emitting display devices. For example, the technical field is related to an organic light emitting display device including a transparent region.

2. Description of the Related Art

An organic light emitting (OLED) display device may include an organic thin layer, a cathode, and an anode. In an operation of the OLED device, electrons and holes are injected into the organic thin layer from the cathode and the anode and then combined to generate excitons for emitting light of a certain wavelength.

For manufacturing the OLED device, a mask may be used in a process of forming the organic material and may contact the anode. The contact by the mask may cause damage to the anode. As a result, image display quality of the OLED device may be unsatisfactory.

SUMMARY

Some example embodiments may be related to an organic light emitting display device having a transparent region.

According to some example embodiments, an organic light emitting display (OLED) device includes a substrate, a semiconductor element, a lower electrode, a light emitting layer, an upper electrode, and a support structure. The substrate has a sub-pixel region and a transparent region. The semiconductor element is disposed in the sub-pixel region on the substrate. The lower electrode is disposed on the semiconductor element. The light emitting layer is disposed on the lower electrode. The upper electrode is disposed in the sub-pixel region on the light emitting layer, and exposes the transparent region. The support structure is disposed in at least a portion of the transparent region on the substrate.

In example embodiments, the support structure may include a first support pattern and a second support pattern, and the first support pattern may be disposed on the substrate, and the second support pattern is disposed on the first support pattern.

In example embodiments, the support structure may include a siloxane-based resin.

In example embodiments, the semiconductor element may include an active layer disposed in the sub-pixel region on the substrate, a gate electrode disposed on the active layer, and source and drain electrodes disposed on the gate electrode.

In example embodiments, the OLED device may further include a pixel defining layer. The pixel defining layer may be disposed on the semiconductor element, and may cover both lateral portions of the lower electrode such that at least a portion of the lower electrode is exposed. The light emitting layer may be disposed on the exposed lower electrode.

In example embodiments, the pixel defining layer may include a siloxane-based resin.

In example embodiments, the OLED device may further include a spacer disposed on a portion of the pixel defining layer.

In example embodiments, the spacer may include a siloxane-based resin.

In example embodiments, the support structure may include a first support pattern that is disposed on the substrate and a second support pattern that is disposed on the first support pattern. A height from an upper surface of the substrate to an upper surface of the spacer may be the same as a height from an upper surface of the substrate to an upper surface of the second support pattern.

In example embodiments, the upper electrode may expose the upper surface of the spacer.

In example embodiments, the pixel defining layer and the spacer may include the same material, and may be integrally formed.

In example embodiments, the support structure may include a first support pattern that is disposed on the substrate and a second support pattern that is disposed on the first support pattern. A height from an upper surface of the substrate to an upper surface of the pixel defining layer may be the same as a height from an upper surface of the substrate to an upper surface of the second support pattern.

In example embodiments, the pixel defining layer and the second support pattern may include the same material, and may be simultaneously formed.

In example embodiments, the OLED device may further include a gate insulation layer and an insulating interlayer. The gate insulation layer may be disposed in the sub-pixel region and the transparent region on the substrate, and may cover the active layer. The insulating interlayer may be disposed in the sub-pixel region and the transparent region on the gate insulation layer, and may cover the gate electrode. The support structure may be disposed on the insulating interlayer.

In example embodiments, the support structure may be spaced apart from the pixel defining layer.

In example embodiments, the OLED device may further include a gate insulation layer, an insulating interlayer, and a planarization layer. The gate insulation layer may be disposed in the sub-pixel region on the substrate, and may cover the active layer. The insulating interlayer may be disposed in the sub-pixel region on the gate insulation layer, and may cover the gate electrode. The planarization layer may be disposed in the sub-pixel region on the substrate such that the transparent region is exposed, and may cover the gate insulation layer, the insulating interlayer, and the source and drain electrodes. The lower electrode and the pixel defining layer may be disposed on the planarization layer.

In example embodiments, the planarization layer may include a siloxane-based resin.

In example embodiments, the support structure may include a first support pattern that is disposed on the substrate and a second support pattern that is disposed on the first support pattern. The planarization layer and the first support pattern may include the same material, and may be simultaneously formed. The pixel defining layer and the second support pattern may include the same material, and may be simultaneously formed.

In example embodiments, a height from an upper surface of the substrate to an upper surface of the planarization layer may be the same as a height from an upper surface of the substrate to an upper surface of the first support pattern.

In example embodiments, the support structure may be spaced apart from the planarization layer.

An example embodiment may be related to a display device. The display device may include a substrate, a first light emitting structure, a second light emitting structure, and a support structure. The first light emitting structure may include a first electrode and a first light emitting layer. A first face of the first electrode may directly contact the first light emitting layer and may overlap the substrate. The second light emitting structure may include a second electrode and a second light emitting layer. A first face of the second electrode may directly contact the second light emitting layer and may overlap the substrate. There may be no light emitting layers of the display device positioned between the first light emitting structure and the second light emitting structure. The support structure may be positioned between the first light emitting structure and the second light emitting structure, may be spaced from each of the first light emitting structure and the second light emitting structure, may overlap a transparent portion of the substrate, and may not include or directly contact any light emitting layer of the display device. A maximum height of the support structure relative to the substrate may be greater than at least one of a maximum height of the first face of the first electrode relative to the substrate and a maximum height of the first light emitting layer relative to the substrate.

A maximum width of the support structure in a direction parallel to the first face of the first electrode may be less than a maximum width of the first face of the first electrode.

The display device may include a planarization layer, which may be spaced from the support structure, may be positioned between the substrate and the first light emitting structure, and may directly contact a second face of the first electrode. The second face of the first electrode may be opposite the first face of the first electrode. A material of the planarization layer may be identical to a material of the support structure.

The support structure may include a first support member and a second support member. The first support member may be positioned between the substrate and the second support member. A maximum width of the first support member in a direction parallel to the first face of the first electrode may be greater than a maximum width of the second support member in the direction parallel to the first face of the first electrode. A maximum height of the first support member relative to the substrate may be equal to a maximum height of the planarization layer relative to the substrate.

The support structure and the planarization layer both directly contact the substrate or both directly contact a material layer that is positioned between the substrate and the support structure.

The display device may include a switching element and an intermediary layer. The switching element may be electrically connected to the first light emitting structure. The intermediary layer may be positioned between the substrate and the first light emitting structure, may directly contact at least one of the substrate and the first switching element, and may directly contact both the support structure and the planarization layer.

The switching element may include an active layer. The intermediary layer may directly contact all of the active layer, the support structure, and the planarization layer.

The switching element may include a drain electrode. The drain electrode may be directly connected to the first electrode. The intermediary layer may directly contact all of the drain electrode, the support structure, and the planarization layer.

The planarization layer may directly contact more faces of the intermediary layer than the support structure.

The display device may include a spacer, which may be positioned between the first light emitting structure and the support structure, may be spaced from each of the first light emitting structure and the support structure, may be positioned closer to the first light emitting structure than to the support structure, and may be shorter than the support structure in a direction perpendicular to the first face of the first electrode. A maximum height of the spacer relative to the substrate may be greater than at least one of the maximum height of the first face of the first electrode relative to the substrate and the maximum height of the first light emitting layer relative to the substrate. The maximum height of the spacer relative to the substrate may be equal to the maximum height of the support structure relative to the substrate.

The display device may include a pixel defining layer, which may be spaced from the support structure. A portion of the first light emitting layer may be positioned between two portions of the pixel defining layer and may directly contact each of the two portions of the pixel defining layer. A maximum height of the pixel defining layer relative to the substrate may be equal to the maximum height of the support structure relative to the substrate.

The display device may include a pixel defining layer, which may be spaced from the support structure. A portion of first light emitting layer may be positioned between two portions of the pixel defining layer and may directly contact each of the two portions of the pixel defining layer. The support structure may include a first support member and a second support member. The first support member may be positioned between the substrate and the second support member and may be wider than the second support member in a direction parallel to the first face of the first electrode. A material of the second support member may be identical to a material of the pixel defining layer.

The display device may include a pixel defining layer and a spacer. The pixel defining layer may be spaced from the support structure. A portion of the first light emitting layer may be positioned between two portions of the pixel defining layer and may directly contact each of the two portions of the pixel defining layer. The spacer may protrude from one of the two portions of the pixel defining layer and may be narrower than each of the two portions of the pixel defining layer in a direction parallel to the first face of the first electrode. A maximum height of the spacer relative to the substrate may be greater than at least one of the maximum height of the first face of the first electrode relative to the substrate and the maximum height of the first light emitting layer relative to the substrate. The maximum height of the spacer relative to the substrate may be equal to the maximum height of the support structure relative to the substrate.

The support structure may include a first support member and a second support member. The first support member may be positioned between the substrate and the second support member and may be wider than the second support member in the direction parallel to the first face of the first electrode. A maximum dimension of a combination of the spacer and the pixel defining layer in a direction perpendicular to the first face of the first electrode may be equal to a maximum dimension of the second support member in the direction perpendicular to the first face of the first electrode.

A material of the second support member may be identical to a material of the spacer.

The spacer and the light emitting layer may directly contact a same face of the pixel defining layer.

An example embodiment may be related to a display device. The display device may include a substrate, a light emitting structure, a pixel defining layer, and a spacer. The light emitting structure may include an electrode and a light emitting layer. A face of the electrode may directly contact the light emitting layer and may overlap the substrate. A portion of the light emitting layer may be positioned between two portions of the pixel defining layer and may directly contact each of the two portions of the pixel defining layer. The spacer may protrude from one of the two portions of the pixel defining layer and may be narrower than each of the two portions of the pixel defining layer in a direction parallel to the first face of the first electrode. A maximum height of the spacer relative to the substrate may be greater than at least one of a maximum height of the face of the electrode relative to the substrate and a maximum height of the light emitting layer relative to the substrate.

The display device may include a support structure, which may be spaced from the pixel defining layer, may overlap a transparent portion of the substrate, and may include a first support member and a second support member. The first support member may be positioned between the substrate and the second support member and may be wider than the second support member in a direction parallel to the face of the electrode. A minimum distance between the pixel defining layer and the substrate may be equal to a minimum distance between the second support member and the substrate.

A maximum height of the second support member relative to the substrate may be greater than at least one of the maximum height of the face of the electrode relative to the substrate and the maximum height of the light emitting layer relative to the substrate.

According to example embodiments, a display device may include a spacer and/or a support structure for preventing a mask from contacting and damaging an electrode and/or a light emitting layer of the display device. Accordingly, satisfactory performance of the electrode and/or the light emitting layer may be attained, such that image display quality of the display device may be satisfactory.

DETAILED DESCRIPTION OF EMBODIMENTS

Example embodiments are explained in detail with reference to the accompanying drawings.

Figure 1:
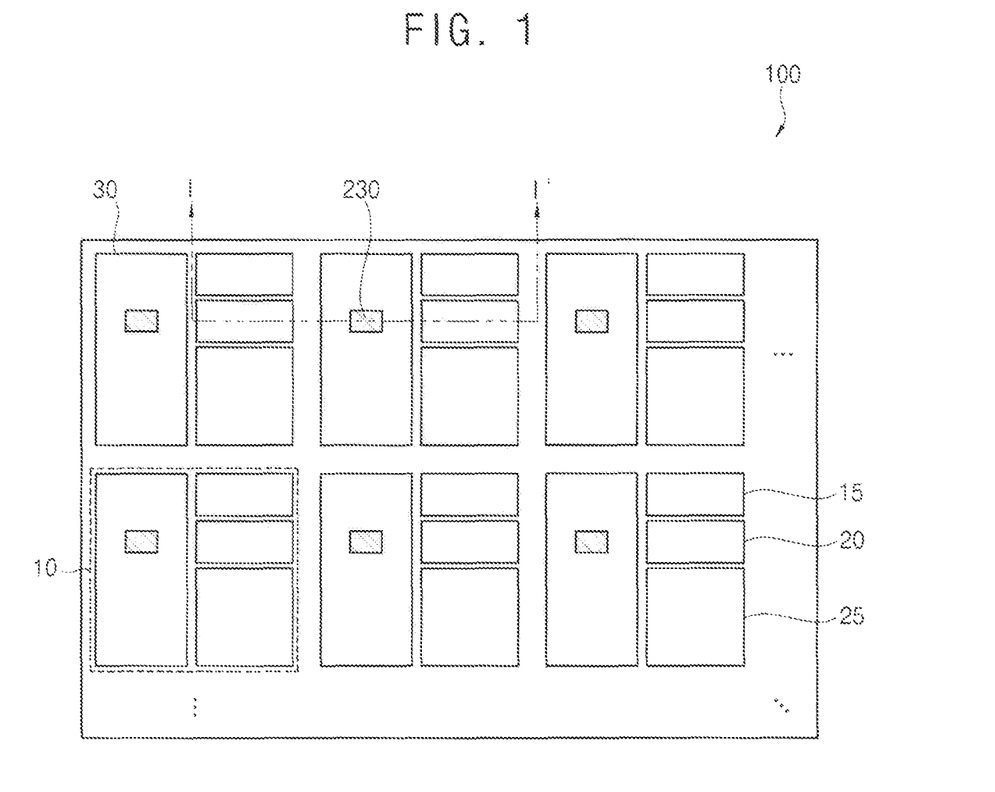
FIG. 1 is a plan view illustrating a display device, e.g., an organic light emitting display (OLED) device, in accordance with example embodiments.

FIG. 1 is a plan view illustrating a display device, e.g., an organic light emitting display (OLED) device, in accordance with example embodiments.

Referring to FIG. 1, a display device, e.g., an organic light emitting display (OLED) device 100, may include a plurality of pixel regions. One pixel region 10 may include first, second, and third sub-pixel region 15, 20, and 25 and a transparent region 30. For example, the pixel regions 10 may be sequentially arranged along first and second directions over the entire substrate, which will be described below, included in the OLED device 100. Here, the first direction may be parallel to an upper surface of the substrate, and the second direction may be perpendicular to the first direction.

The pixel regions 10 each may include the first, second, and third sub-pixel region 15, 20, and 25 and the transparent region 30. The first, second, and third sub-pixel region 15, 20, and 25 and the transparent region 30 may be surrounded by a pixel defining layer, which will be described below, included in the OLED device 100. For example, the first, second, and third sub-pixel region 15, 20, and 25 and the transparent region 30 may be defined by the pixel defining layer. That is, in one pixel region 10, the pixel defining layer may be disposed in a portion except the first, second, and third sub-pixel region 15, 20, and 25 and the transparent region 30. In example embodiments, a spacer included in the OLED device 100 may be disposed in a portion of the pixel defining layer. The spacer may protrude in a direction that is vertical to the first and second directions, and may be in contact with a mask that will be described below. Here, the mask may be used in a process for forming an organic material in the transparent region 30 or a process for forming light emitting layers in the first, second, and third sub-pixel region 15, 20, and 25, respectively. The spacer may support the mask.

In the first, second, and third sub-pixel region 15, 20, and 25, first, second, and third sub-pixels may be disposed. For example, the first sub-pixel may emit a red color of light, and the second sub-pixel may emit a green color of light. In embodiments, the third sub-pixel may emit a blue color of light. The first through third sub-pixels may be substantially located at the same level on the substrate.

In the transparent region 30, a light incident from the outside may be transmitted. For example, an image of an object (or a target) that is located in the rear (or at the back) of the OLED device 100 may be transmitted through the transparent region 30. In example embodiments, a support structure 230 may be disposed in the transparent region 30. A plan view of the support structure 230 illustrated in FIG. 1 has a planar shape of a tetragon, but not being limited thereto. For example, a plan view of the support structure 230 may have a planar shape of a triangle, a planar shape of a diamond, a planar shape of a polygon, a planar shape of a circle, a planar shape of an athletic track, or a planar shape of an ellipse. The support structure 230 may protrude in the direction that is vertical to the first and second directions, and may be in contact with a mask that will be described below. Here, the mask may be used in a process for forming an organic material in the transparent region 30. That is, the support structure 230 may support the mask.

In example embodiments, the pixel region 10 includes one transparent region 30, but not being limited thereto. For example, in some example embodiments, a plurality of pixel regions 10 may be shared by one transparent region 30.

In embodiments, the pixel regions 10 are regularly arranged, but not being limited thereto. For example, the pixel regions 10 may be irregularly arranged.

Figure 2:
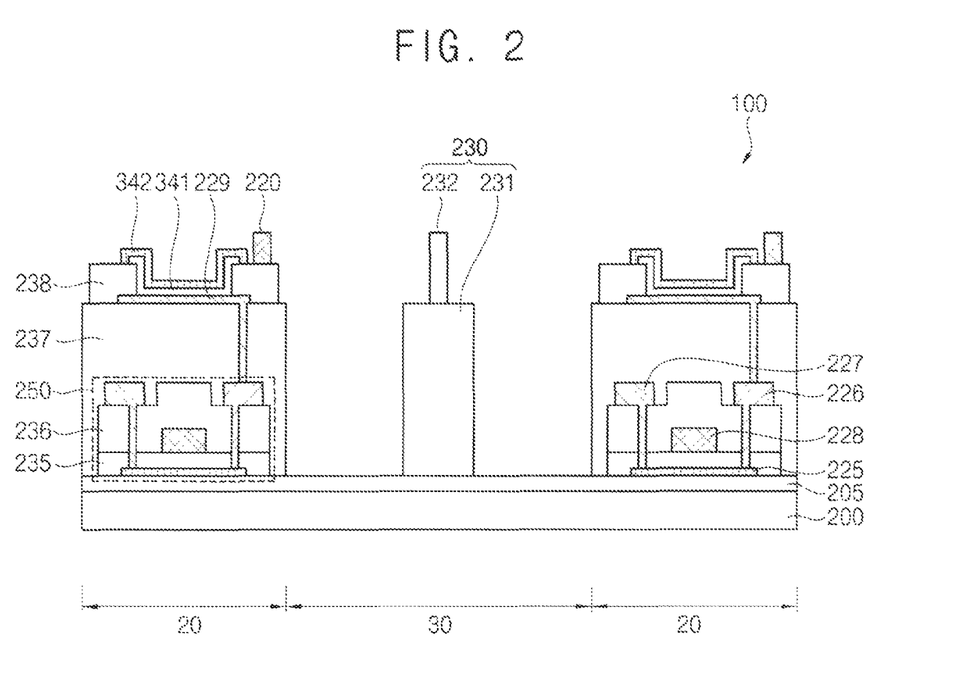
FIG. 2 is a cross-sectional view taken along a line I-I' of FIG. 1 in accordance with example embodiments.

FIG. 2 is a cross-sectional view taken along a line I-I' of FIG. 1 in accordance with example embodiments.

Referring to FIG. 2, a display device 100, e.g., an OLED device 100, may include a substrate 200, a buffer layer 205, a semiconductor element 250 (or switching element 250), a gate insulation layer 235, an insulating interlayer 236, a planarization layer 237, a lower electrode 229 (e.g., an anode electrode), a light emitting layer 341, an upper electrode 342 (e.g., a cathode electrode), a pixel defining layer 238, a spacer 220, a support structure 230, etc. Here, the semiconductor element 250 may include an active layer 225 (or semiconductor layer 225), a gate electrode 228, a source electrode 227, and a drain electrode 226.

As described above, the OLED device 100 may include a plurality of pixel regions. One pixel region may have a sub-pixel region 20 (e.g., a second sub-pixel region of FIG. 1) and a transparent region 30.

The semiconductor element 250, the lower electrode 229, the light emitting layer 341, the upper electrode 342, the pixel defining layer 238, and the spacer 220 may be disposed in the sub-pixel region 20. The support structure 230 may be disposed in the transparent region 30.

An image may be displayed in the sub-pixel region 20, and an object that is located in the rear of the OLED device 100 may be visible through the transparent region 30. As the OLED device 100 includes the transparent region 30, the OLED device 100 may serve as a transparent display device.

The substrate 200 may be provided. The substrate 200 may be formed of or may include transparent material(s) or opaque material(s). For example, the substrate 200 may include at least one of a quartz substrate, a synthetic quartz substrate, a calcium fluoride substrate, a fluoride-doped quartz substrate, a sodalime glass substrate, a non-alkali glass substrate, etc. In an embodiment, the substrate 200 may be formed of a flexible transparent material such as a flexible transparent resin substrate (e.g., a polyimide substrate). For example, the polyimide substrate may include at least one of a first polyimide layer, a barrier film layer, a second polyimide layer, etc. Since the polyimide substrate is relatively thin and flexible, the polyimide substrate may be disposed on a rigid glass substrate to help support the formation of the pixel structure (e.g., the semiconductor element 250, the lower electrode 229, the light emitting layer 341, the upper electrode 342, etc.). That is, the substrate 200 may have a structure in which the first polyimide layer, the barrier film layer and the second polyimide layer are stacked on a rigid glass substrate. In manufacturing the OLED device 100, after an insulating layer (e.g., a buffer layer) is provided on the second polyimide layer of the polyimide substrate, the pixel structure may be disposed on the insulating layer. After the pixel structure is formed on the insulating layer, the rigid glass substrate on which the polyimide substrate is disposed may be removed. It may be difficult to directly form the pixel structure on the polyimide substrate because the polyimide substrate is relatively thin and flexible. Accordingly, the pixel structure is formed on the polyimide substrate that is coupled to a rigid glass substrate, and then the polyimide substrate may serve as the substrate 200 of the OLED device 100 after removal of the rigid glass substrate. As the OLED device 100 includes the sub-pixel region 20 and the transparent region 30, the substrate 200 may also include the sub-pixel region 20 and the transparent region 30.

The buffer layer 205 may be disposed on the entire substrate 200. The buffer layer 205 may prevent the diffusion of metal atoms and/or impurities from the substrate 200 into the semiconductor element 250. In embodiments, the buffer layer 205 may control a rate of heat transfer in a crystallization process for forming the active layer 225, thereby obtaining a substantially uniform active layer. Furthermore, the buffer layer 205 may improve a surface flatness of the substrate 200 when a surface of the substrate 200 is relatively uneven. According to the type of substrate 200, at least two buffer layers 205 may be provided on the substrate 200, or the buffer layer 205 may not be present. The buffer layer 205 may include transparent organic material(s) and/or transparent inorganic material(s). For example, the organic materials may include at least one of a photoresist, a polyacryl-based resin, a polyimide-based resin, a polyamide-based resin, a siloxane-based resin, an acryl-based resin, an epoxy-based resin, etc. The inorganic materials may include at least one of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The semiconductor element 250 may be formed of the active layer 225, the gate electrode 228, the source electrode 227, and the drain electrode 226. The semiconductor element 250 may be disposed in the sub-pixel region 20 on the substrate 200.

The active layer 225 may be disposed in the sub-pixel region 20 on the substrate 200. For example, the active layer 225 may include at least one of an oxide semiconductor, an inorganic semiconductor (e.g., amorphous silicon, polysilicon, etc.), an organic semiconductor, etc.

The gate insulation layer 235 may be disposed on the active layer 225. The gate insulation layer 235 may be disposed in the sub-pixel region 20 on the substrate 200. The gate insulation layer 235 may cover the active layer 225 in the sub-pixel region 20, and may expose the transparent region 30. For example, the gate insulation layer 235 may sufficiently cover the active layer 225, and may have a substantially even surface without a step around the active layer 225. In an embodiment, the gate insulation layer 235 may cover the active layer 225, and may be disposed with a substantially uniform thickness along a profile of the active layer 225. The gate insulation layer 235 may include at least one of a silicon compound, a metal oxide, etc. In some example embodiments, the gate insulation layer 235 may be disposed on the sub-pixel region 20 and the transparent region 30 on the substrate 200. In this case, the gate insulation layer 235 may include substantially transparent materials.

The gate electrode 228 may be disposed in the sub-pixel region 20 on the gate insulation layer 235. The gate electrode 228 may overlap the active layer 225. The gate electrode 228 may include at least one of a metal, a metal alloy, metal nitride, conductive metal oxide, transparent conductive materials, etc. For example, the gate electrode 228 may include at least one of gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. In some example embodiments, the gate electrode 228 may have a multi-layered structure.

The insulating interlayer 236 may be disposed on the gate electrode 228 and the gate insulation layer 235. The insulating interlayer 236 may be disposed in the sub-pixel region 20 on the substrate 200, and may expose the transparent region 30. The insulating interlayer 236 may cover the gate electrode 228 in the sub-pixel region 20. For example, the insulating interlayer 236 may sufficiently cover the gate electrode 228, and may have a substantially even surface without a step around the gate electrode 228. In an embodiment, the insulating interlayer 236 may cover the gate electrode 228, and may be disposed with a substantially uniform thickness along a profile of the gate electrode 228. The insulating interlayer 236 may include at least one of a silicon compound, a metal oxide, etc. In some example embodiments, the insulating interlayer 236 may be disposed in the sub-pixel region 20 and the transparent region 30 on the substrate 200. In this case, the insulating interlayer 236 may include at least one of substantially transparent materials.

Each of the source electrode 227 and the drain electrode 226 may be disposed on the insulating interlayer 236. The source electrode 227 may be in contact with a first side of the active layer 225 via a contact hole formed in the gate insulation layer 235 and the insulating interlayer 236. The drain electrode 226 may be in contact with a second side of the active layer 225 via a contact hole formed in the gate insulation layer 235 and the insulating interlayer 236. Each of the source electrode 227 and the drain electrode 226 may include at least one of a metal, a metal alloy, metal nitride, conductive metal oxide, transparent conductive materials, etc. Accordingly, the semiconductor element 250 including the active layer 225, the gate electrode 228, the source electrode 227, and the drain electrode 226 may be disposed.

In example embodiments, the semiconductor element 250 of the OLED device 100 has a top gate structure, but not being limited thereto. For example, in some example embodiments, the semiconductor element 250 may have a bottom gate structure.

The planarization layer 237 may be disposed on the source and drain electrodes 227 and 226 and the insulating interlayer 236. The planarization layer 237 may cover the semiconductor element 250, the gate insulation layer 235, and the insulating interlayer 236 in the sub-pixel region 20, and may expose the transparent region 30. That is, the semiconductor element 250, the gate insulation layer 235, and the insulating interlayer 236 may be surrounded by the planarization layer 237 in the sub-pixel region 20. For example, the planarization layer 237 may be disposed with a relatively high thickness to sufficiently cover the source and drain electrodes 227 and 226. In this case, the planarization layer 237 may have a substantially even upper surface, and a planarization process may be further performed on the planarization layer 237 to implement the even upper surface of the planarization layer 237. In an embodiment, the planarization layer 237 may cover the source and drain electrodes 227 and 226, and may be disposed at a substantially uniform thickness along a profile of the source and drain electrodes 227 and 226. The planarization layer 237 may include organic materials or inorganic materials. In example embodiments, the planarization layer 237 may include a siloxane-based resin.

The lower electrode 229 may be disposed in the sub-pixel region 20 on the planarization layer 237. The lower electrode 229 may be in contact with the drain electrode 226 via a contact hole formed in the planarization layer 237. In embodiments, the lower electrode 229 may be electrically connected to the semiconductor element 250. The lower electrode 229 may include at least one of a metal, a metal alloy, metal nitride, conductive metal oxide, transparent conductive materials, etc. These may be used alone or in a suitable combination thereof. In some example embodiments, the lower electrode 229 may have a multi-layered structure.

The pixel defining layer 238 may be disposed on the planarization layer 237 to expose a portion of the lower electrode 229. For example, the pixel defining layer 238 may cover both lateral portions (e.g., outer edges in the planar view) of the lower electrode 229, and may expose the transparent region 30. The pixel defining layer 238 may include organic materials or inorganic materials. In example embodiments, the pixel defining layer 238 may include a siloxane-based resin.

The light emitting layer 341 may be disposed on an exposed portion of the lower electrode 229. The light emitting layer 341 may have a multi-layered structure including an emission layer (EL), a hole injection layer (HIL), a hole transfer layer (HTL), an electron transfer layer (ETL), an electron injection layer (EIL), etc. The EL of the light emitting layer 341 may be formed using at least one of light emitting materials capable of generating different colors of light (e.g., a red color of light, a blue color of light, and a green color of light, and the like.) according to first, second, and third sub-pixels illustrated in FIG. 1. In an embodiment, the EL of the light emitting layer 341 may generally generate a white color of light by stacking a plurality of light emitting materials capable of generating different colors of light such as a red color of light, a green color of light, a blue color of light, and the like. In some example embodiments, the HIL, the HTL, the ETL, the EIL except the EL may be disposed in the transparent region 30.

The upper electrode 342 may be disposed on the pixel defining layer 238 and the light emitting layer 341, and may not be disposed in the transparent region 30. That is, the upper electrode 342 may expose the transparent region 30. In example embodiments, after the pixel defining layer 238 and the planarization layer 237 is removed in the transparent region 30 (e.g., after the light emitting layer 341 is disposed), an organic layer (e.g., a weak adhesive layer: WAL) may be disposed in the transparent region 30. When the organic layer is disposed in the transparent region 30, in a process for forming the upper electrode 342, the upper electrode 342 may not be disposed in a region where the organic layer is located. That is, the region where the upper electrode 342 is disposed may be controlled. The upper electrode 342 may cover the pixel defining layer 238 and the light emitting layer 341 in the sub-pixel region 20 except the transparent region 30, may be disposed on the entire substrate 200. As the upper electrode 342 is not disposed in the transparent region 30, a transmissivity of the transparent region 30 of the OLED device 100 may be increased. In an embodiment, the organic layer may further be disposed on the spacer 220 that is located in the sub-pixel region 20 such that the upper electrode 342 is not disposed on the spacer 220. The upper electrode 342 may include at least one of a metal, a metal alloy, metal nitride, conductive metal oxide, transparent conductive materials, etc. These may be used alone or in a suitable combination thereof. In embodiments, the organic layer may include lithium quinoline (LiQ). The LiQ may have a low adhesive strength to a metal, and may be transparent.

The spacer 220 may be disposed on the pixel defining layer 238. In example embodiments, the spacer 220 may be disposed on a portion of the pixel defining layer 238 surrounding the light emitting layer 341. In an embodiment, two spacers 220 may be respectively disposed on a first portion and a second portion of the pixel defining layer 238, wherein the second portion faces (or is opposite to) the first portion. The spacer 220 may support a mask that is used in a process for forming the light emitting layer 341 and/or a mask that is used in a process for forming the organic layer disposed in the transparent region 30. The spacer 220 may include organic material(s) and/or inorganic material(s).

The support structure 230 may be disposed in a portion of the transparent region 30 on the buffer layer 205. In example embodiments, a plan view of the support structure 230 has a planar shape of a tetragon, but not being limited thereto. For example, in some example embodiments, a plan view of the support structure 230 may have a planar shape of a triangle, a planar shape of a diamond, a planar shape of a polygon, a planar shape of a circle, a planar shape of an athletic track, or a planar shape of an ellipse. In example embodiments, the support structure 230 may not directly contact the planarization layer 237 and may not directly contact the pixel defining layer 238. For example, the support structure 230 may support a portion of the mask such that the mask is substantially parallel to an upper surface of the substrate 200. The support structure 230 may include a first support pattern 231 (or first support member 231) and a second support pattern 232 (or second support member 232). The first support pattern 231 may be disposed on the buffer layer 205, and the second support pattern 232 may be disposed on the first support pattern 231. A distance from an upper surface of the substrate 200 to an upper surface of the second support pattern 232 may be equal to a distance from an upper surface of the substrate 200 to an upper surface of the spacer 220. In embodiments, a distance from an upper surface of the substrate 200 to an upper surface of the first support pattern 231 may be equal to a distance from an upper surface of the substrate 200 to an upper surface of the planarization layer 237. In an embodiment, a distance from an upper surface of the substrate 200 to an upper surface of the second support pattern 232 may be unequal to a distance from an upper surface of the substrate 200 to an upper surface of the spacer 220. In embodiments, a distance from an upper surface of the substrate 200 to an upper surface of the first support pattern 231 may be unequal to a distance from an upper surface of the substrate 200 to an upper surface of the planarization layer 237. The support structure 230 may support a mask that is used in a process for forming the light emitting layer 341 and/or a mask that is used in a process forming the organic layer. That is, the support structure 230 and the spacer 220 may perform the same function. As the spacer 220 and the support structure 230 are disposed, the OLED device 100 may prevent the masks from directly contacting the lower electrode 229 and/or the light emitting layer 341. The first support pattern 231 and the planarization layer 237 may include the same material, and may be simultaneously formed. In embodiments, the second support pattern 232 and the pixel defining layer 238 may include the same material, and may be simultaneously formed. For example, the support structure 230 may include organic material(s) and/or inorganic material(s). In example embodiments, the support structure 230 may include a siloxane-based resin, and a sufficient transmissivity of the transparent region 30 of the OLED device 100 may be attained.

In example embodiments, one support structure 230 of the OLED device 100 is disposed in the transparent region 30, but not being limited thereto. In some example embodiments, at least two support structures 230 may be disposed in the transparent region 30.

An encapsulation substrate (not shown) may be disposed on the upper electrode 342. The encapsulation substrate and the substrate 200 may include substantially the same materials. For example, the encapsulation substrate may include at least one of quartz substrate, synthetic quartz substrate, calcium fluoride substrate, fluoride-doped quartz substrate, sodalime glass substrate, non-alkali glass substrate etc. In some example embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may include a stacked structure where at least one inorganic layer and at least one organic layer are alternately stacked.

In accordance with example embodiments, the spacer 220 and/or the support structure 230 of the OLED device 100 may prevent one or more masks from contacting and damaging the lower electrode 229. Accordingly, satisfactory quality of lower electrode 229 may be attained, such that satisfactory image display quality of the OLED device 100 may be attained.

FIGS. 3A, 3B, 3C, 3D, 3E, 3F, 3G 3H, 3I, 3J, and 3K are cross-sectional views illustrating a method for manufacturing a display device, e.g., an OLED device, in accordance with example embodiments.

Figure 3A:
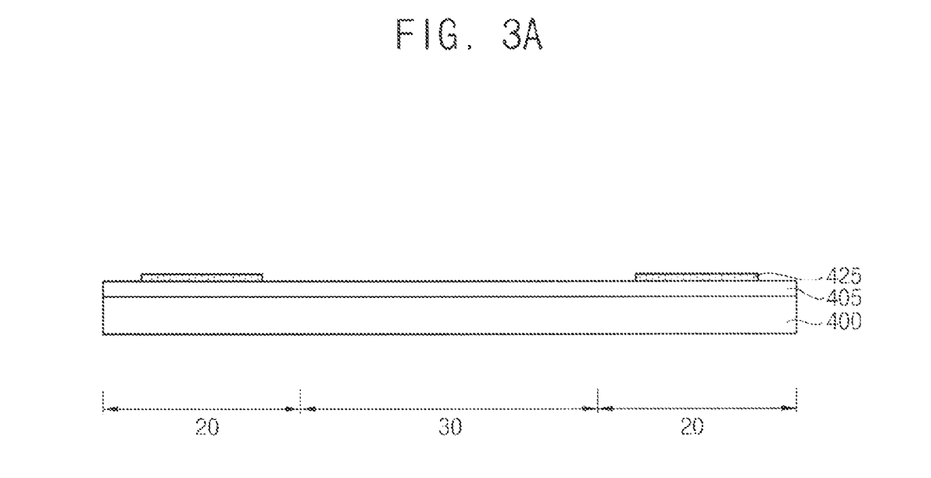
FIG. 3A, FIG. 3B, FIG. 3C, FIG. 3D, FIG. 3E, FIG. 3F, FIG. 3G FIG. 3H, FIG. 3I, FIG. 3J, and FIG. 3K are cross-sectional views illustrating a method of manufacturing a display device, e.g., an OLED device, in accordance with example embodiments.

Referring to FIG. 3A, a substrate 400 may be provided. The substrate 400 may be formed of transparent materials or opaque materials. For example, the substrate 400 may be formed using a quartz substrate, a synthetic quartz substrate, a calcium fluoride substrate, a fluoride-doped quartz substrate, a sodalime glass substrate, a non-alkali glass substrate, etc.

A buffer layer 405 may be formed on the entire substrate 400. The buffer layer 405 may prevent the diffusion of metal atoms and/or impurities from the substrate 400 into a semiconductor element. In embodiments, the buffer layer 405 may control a rate of heat transfer in a crystallization process for forming active layer, thereby obtaining a substantially uniform active layer. Furthermore, the buffer layer 405 may improve a surface flatness of the substrate 400 when a surface of the substrate 400 is relatively uneven. The buffer layer 405 may be formed using transparent organic materials or transparent inorganic materials. For example, the organic materials may include at least one of a photoresist, a polyacryl-based resin, a polyimide-based resin, a polyamide-based resin, a siloxane-based resin, an acryl-based resin, an epoxy-based resin, etc. The inorganic materials may include at least one of $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

An active layer 425 may be formed in a sub-pixel region 20 on the substrate 400. For example, the active layer 425 may be formed using an oxide semiconductor, an inorganic semiconductor, an organic semiconductor, etc.

Figure 3B:
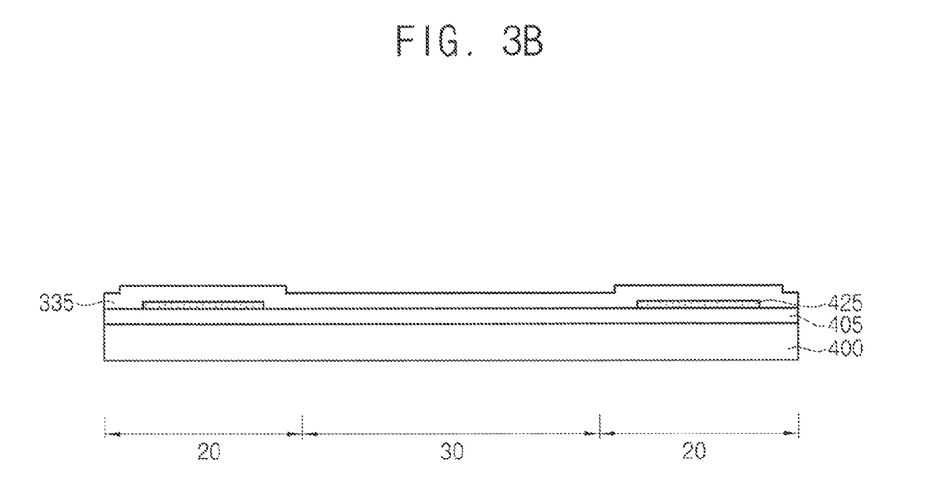

Referring to FIG. 3B, a preliminary gate insulation layer 335 may be formed on the active layer 225. The preliminary gate insulation layer 335 may be formed in the sub-pixel region 20 and a transparent region 30 on the substrate 400. That is, the preliminary gate insulation layer 335 may be formed on the entire substrate 400. The preliminary gate insulation layer 335 may cover the active layer 425 in the sub-pixel region 20, and may extend in a direction from the sub-pixel region 20 into the transparent region 30. For example, the preliminary gate insulation layer 335 may sufficiently cover the active layer 425, and may have a substantially even surface without a step around the active layer 425. The preliminary gate insulation layer 335 may be formed using a silicon compound, a metal oxide, etc.

Figure 3C:
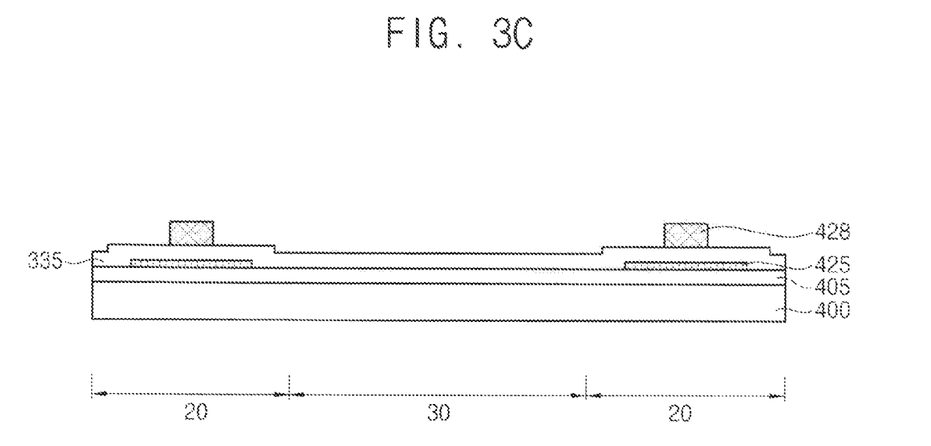

Referring to FIG. 3C, a gate electrode 428 may be formed in the sub-pixel region 20 on the preliminary gate insulation layer 335. The gate electrode 428 may overlap the active layer 425. The gate electrode 428 may include at least one of a metal, a metal alloy, metal nitride, conductive metal oxide, transparent conductive materials, etc. For example, the gate electrode 428 may be formed using at least one of Au, Ag, Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof.

Figure 3D:
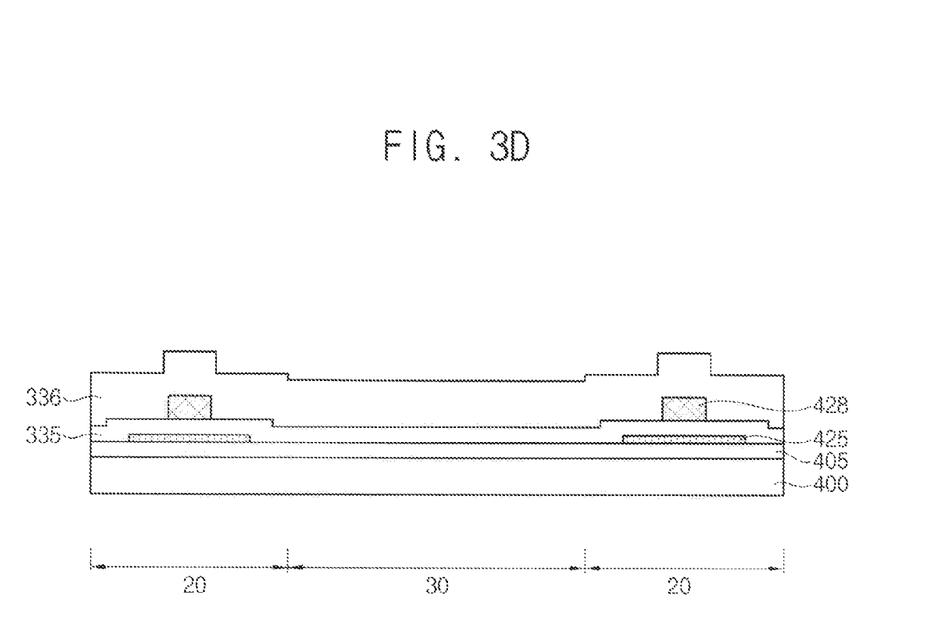

Referring to FIG. 3D, a preliminary insulating interlayer 336 may be formed on the gate electrode 428 and the preliminary gate insulation layer 335. The preliminary insulating interlayer 336 may formed in the sub-pixel region 20 and the transparent region 30 on the substrate 400. That is, the preliminary insulating interlayer 336 may be formed on the entire substrate 400. The preliminary insulating interlayer 336 may cover the gate electrode 428 in the sub-pixel region 20, and may extend in a direction that is parallel to an upper surface of the substrate 400. For example, the preliminary insulating interlayer 336 may sufficiently cover the gate electrode 428, and may have a substantially even surface without a step around the gate electrode 428. The preliminary insulating interlayer 336 may be formed using a silicon compound, a metal oxide, etc.

Figure 3E:
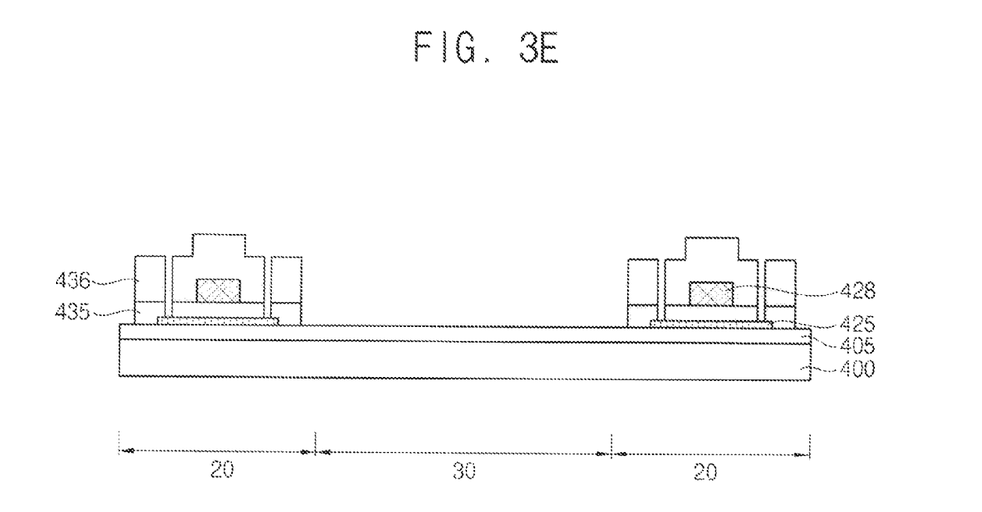

Referring to FIG. 3E, a gate insulation layer 335 and an insulating interlayer 336 may be formed by partially removing the preliminary gate insulation layer 335 and the preliminary insulating interlayer 336. The gate insulation layer 335 and the insulating interlayer 336 may be formed in the sub-pixel region 20 on the substrate 400. That is, the gate insulation layer 335 and the insulating interlayer 336 may expose the transparent region 30 on the substrate 400. In embodiments, a first contact hole that exposes a source region of the active layer 425 may be formed by removing a first portion of the gate insulation layer 335 and the insulating interlayer 336, and a second contact hole that exposes a drain region of the active layer 425 may be formed by removing a first portion of the gate insulation layer 335 and the insulating interlayer 336.

Figure 3F:
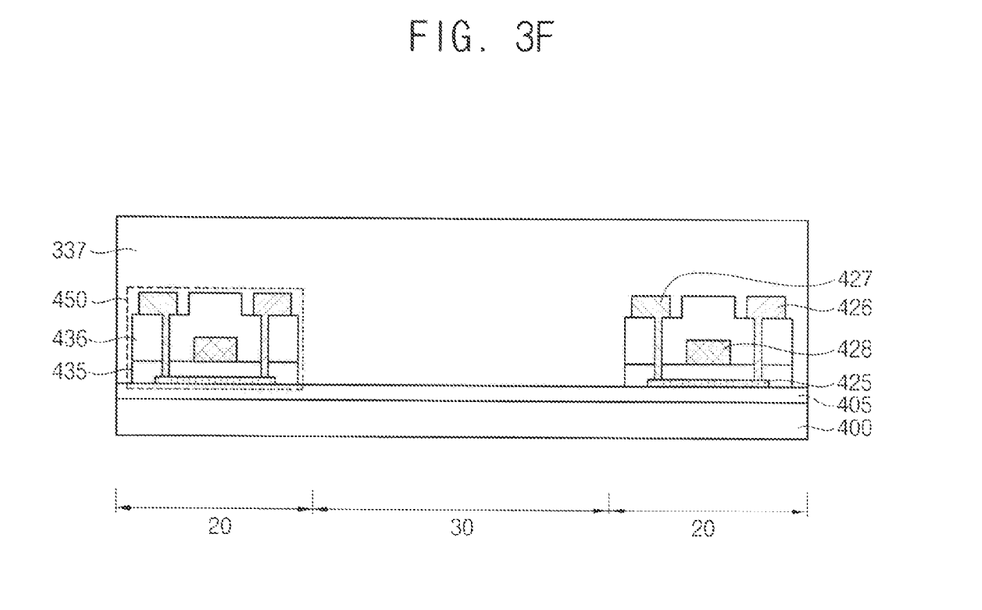

Referring to FIG. 3F, a source electrode 427 and a drain electrode 426 may be formed on the insulating interlayer 436. The source electrode 427 may be in contact with the source region of the active layer 425 perforating the first contact hole formed in the gate insulation layer 435 and the insulating interlayer 436. The drain electrode 426 may be in contact with the drain region of the active layer 425 perforating the second contact hole formed in the gate insulation layer 435 and the insulating interlayer 436. Each of the source electrode 427 and the drain electrode 426 may be formed using a metal, a metal alloy, metal nitride, conductive metal oxide, transparent conductive materials, etc. Accordingly, a semiconductor element 450 including the active layer 425, the gate electrode 428, the source electrode 427, and the drain electrode 426 may be formed.

A preliminary planarization layer 337 may be formed on the source and drain electrodes 427 and 426 and the insulating interlayer 436. The preliminary planarization layer 337 may cover the semiconductor element 450, the gate insulation layer 435, and the insulating interlayer 436 in the sub-pixel region 20, and may extend in a direction form the sub-pixel region 20 into the transparent region 30. That is, the preliminary planarization layer 337 may be formed in the sub-pixel region 20 and the transparent region 30 on the entire buffer layer 405. The preliminary planarization layer 337 may be formed with a relatively high thickness to sufficiently cover the source and drain electrodes 427 and 426. In this case, the preliminary planarization layer 337 may have a substantially even upper surface, and a planarization process may be further performed on the preliminary planarization layer 337 to implement the even upper surface of the preliminary planarization layer 337. The preliminary planarization layer 337 may include organic materials or inorganic materials. In example embodiments, the preliminary planarization layer 337 may be formed using a siloxane-based resin.

Figure 3G:
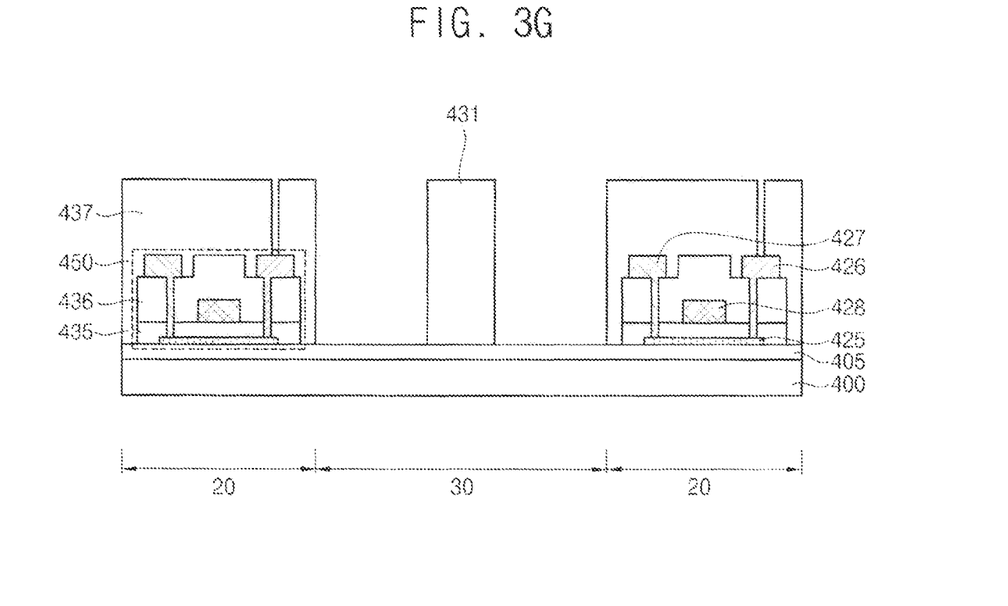

Referring to FIG. 3G a planarization layer 437 and a first support pattern 431 may be formed by partially removing the preliminary planarization layer 337. The planarization layer 437 may be formed in the sub-pixel region 20 on the buffer layer 405, and the first support pattern 431 may be formed in the transparent region 30. That is, the planarization layer 437 may expose the transparent region 30 on the substrate 400, and the first support pattern 431 may be spaced apart from the planarization layer 437 such that the first support pattern 431 is not in contact with the planarization layer 437. In embodiments, a third contact hole that exposes a portion of the drain electrode 426 may be formed by removing a third portion of the planarization layer 437. In example embodiments, the planarization layer 437 and the first support pattern 431 may be simultaneously formed using the same material. In embodiments, when the first support pattern 431 is formed as a siloxane-based resin, a transmissivity of the transparent region 30 of an OLED device may not be significantly decreased.

Figure 3H:
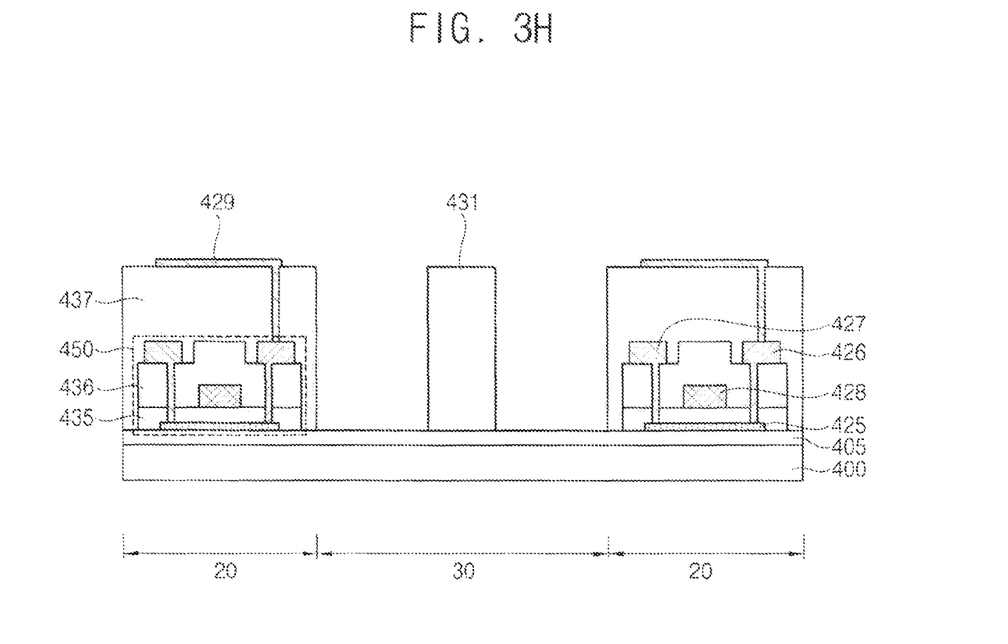

Referring to FIG. 3H, a lower electrode 429 may be formed in the sub-pixel region 20 on the planarization layer 437. The lower electrode 429 may be in contact with the drain electrode 426 perforating the third contact hole formed in the planarization layer 437. The lower electrode 429 may be formed using a metal, a metal alloy, metal nitride, conductive metal oxide, transparent conductive materials, etc. These may be used alone or in a suitable combination thereof.

Figure 3I:
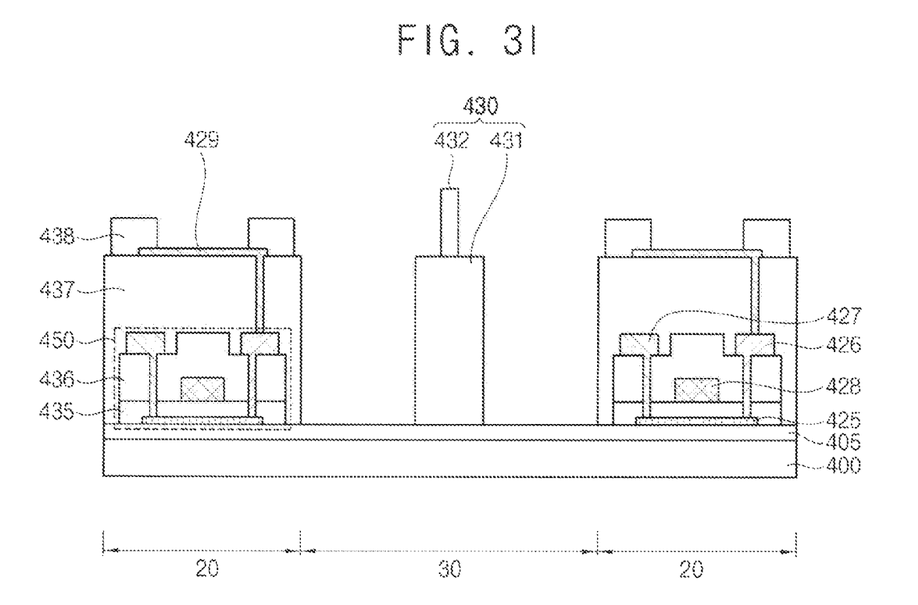

Referring to FIG. 3I, after a preliminary pixel defining layer is formed on the planarization layer 437 and the lower electrode 429, a pixel defining layer 438 and a second support pattern 432 may be formed by partially removing the preliminary pixel defining layer. The pixel defining layer 438 may be formed on the planarization layer 437 to expose a portion of the lower electrode 429. For example, the pixel defining layer 438 may cover both lateral portions (e.g., outer edges in the planar view) of the lower electrode 429, and may expose the transparent region 30. The pixel defining layer 438 may include organic materials or inorganic materials. In example embodiments, the pixel defining layer 438 may be formed using a siloxane-based resin. The second support pattern 432 may be formed on the first support pattern 431. In example embodiments, the pixel defining layer 438 and the second support pattern 432 may be simultaneously formed using the same material. In embodiments, when the second support pattern 432 is formed as a siloxane-based resin, a transmissivity of the transparent region 30 of the OLED device may not be significantly decreased. Accordingly, a support structure 430 including the first support pattern 431 and the second support pattern 432 may be formed.

Figure 3J:
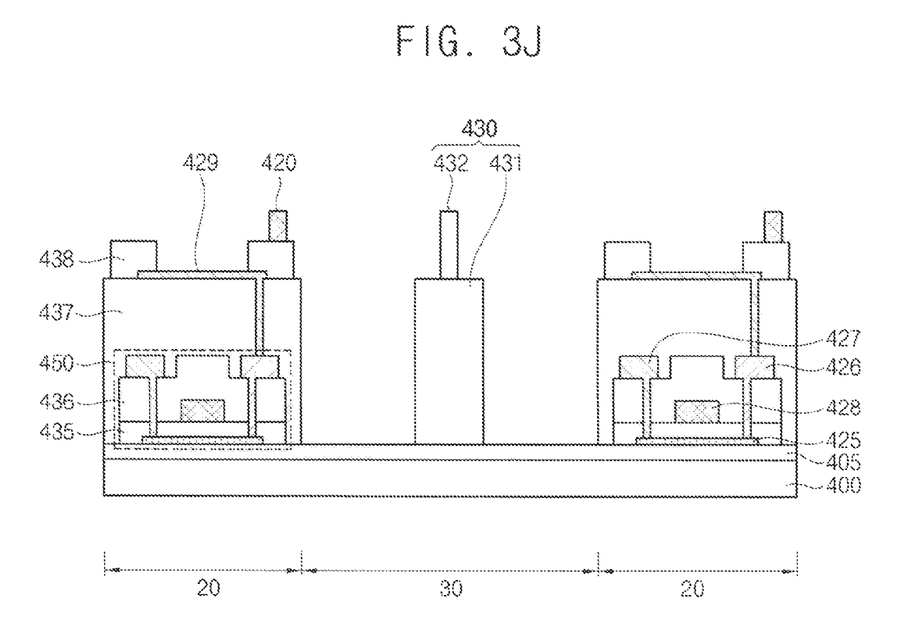

Referring to FIG. 3J, a spacer 420 may be formed on the pixel defining layer 438. In example embodiments, the spacer 420 may be formed on a portion of the pixel defining layer 438. The spacer 420 may be formed using organic materials or inorganic materials.

Figure 3K:
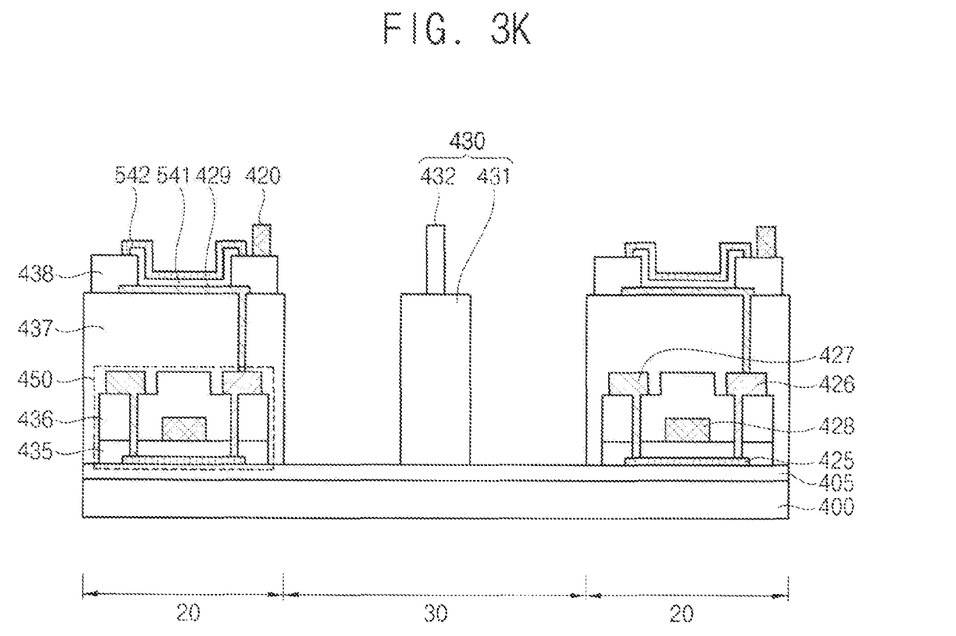

Referring to FIG. 3K, a light emitting layer 541 may be formed on an exposed portion of the lower electrode 429. The light emitting layer 541 may have a multi-layered structure including EL, HIL, HTL, ETL, EIL, etc. The EL of the light emitting layer 341 may be formed using at least one of light emitting materials capable of generating different colors of light (e.g., a red color of light, a blue color of light, and a green color of light, and the like.) according to first, second, and third sub-pixels illustrated in FIG. 1. The spacer 420 and the support structure 430 may support a mask such that the mask that is used in a process for forming the light emitting layer 541 is not in contact with the lower electrode 429.

After the light emitting layer 541 is formed, an organic layer may be formed in the transparent region 30. The organic layer may be formed using LiQ. The LiQ may have a low adhesive strength to a metal, and may be transparent. The spacer 420 and the support structure 430 may support a mask used in a process for forming the organic layer such that the mask does not directly contact the lower electrode 429. In embodiments, the spacer 420 and the support structure 430 may support a mask used in a process for forming the organic layer such that the mask does not directly contact the light emitting layer 541. In an embodiment, the organic layer may cover the spacer 420 in the sub-pixel region 20 such that the upper electrode 542 is not formed on the spacer 420.

An upper electrode 542 may be formed on the pixel defining layer 438 and the light emitting layer 541, and may not be formed in the transparent region 30. That is, the upper electrode 542 may expose the transparent region 30. For example, in a process for forming the upper electrode 542, the upper electrode 542 may not be formed in a region where the organic layer is located. That is, the region where the upper electrode 542 is formed may be controlled. The upper electrode 542 may cover the pixel defining layer 438 and the light emitting layer 541 in the sub-pixel region 20 except the transparent region 30, may be formed on the entire substrate 400. The upper electrode 542 may be formed using a metal, a metal alloy, metal nitride, conductive metal oxide, transparent conductive materials, etc. These may be used alone or in a suitable combination thereof. Accordingly, the OLED device 100 illustrated in FIG. 2 may be manufactured.

Figure 4:
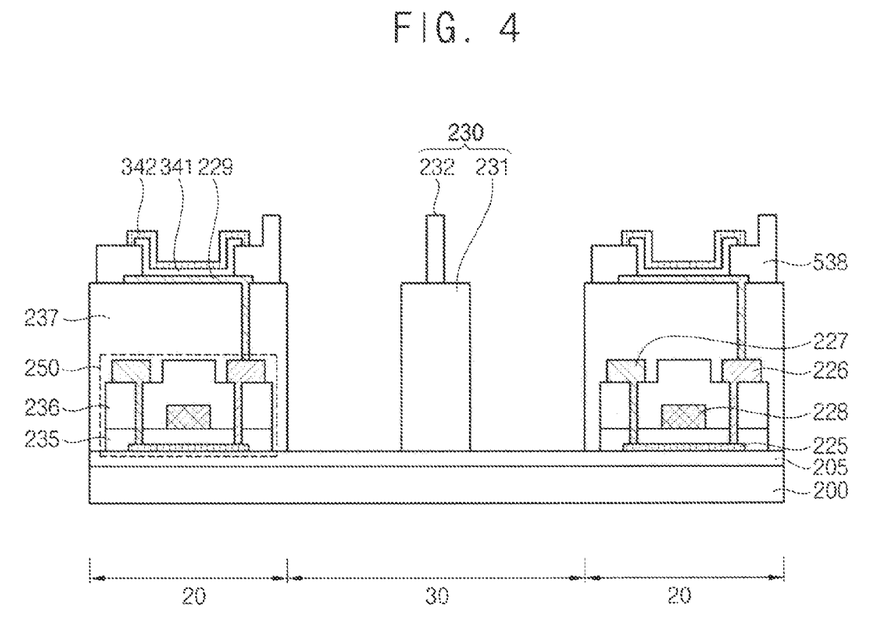
FIG. 4 is a cross-sectional view illustrating a display device, e.g., an OLED device, in accordance with example embodiments.

FIG. 4 is a cross-sectional view illustrating a display device, e.g., an OLED device, in accordance with example embodiments. An OLED device illustrated in FIG. 4 may have a configuration substantially the same as or similar to that of an OLED device 100 described with reference to FIG. 2 except a pixel defining layer 538. In FIG. 4, detailed descriptions for elements that are substantially the same as or similar to elements described with reference to FIG. 2 may not be repeated.

Referring to FIG. 4, an OLED device may include a substrate 200, a buffer layer 205, a semiconductor element 250, a gate insulation layer 235, an insulating interlayer 236, a planarization layer 237, a lower electrode 229, a light emitting layer 341, an upper electrode 342, a pixel defining layer 538, a support structure 230, etc. Here, the semiconductor element 250 may include an active layer 225, a gate electrode 228, a source electrode 227, and a drain electrode 226. In embodiments, the support structure 230 may include a first support pattern 231 and a second support pattern 232.

The pixel defining layer 538 may be disposed on the planarization layer 237 to expose at least a portion of the lower electrode 229. For example, the pixel defining layer 538 may cover both lateral portions of the lower electrode 229, and may expose the transparent region 30. In example embodiments, the pixel defining layer 538 may include a protrusion portion. The protrusion portion may serve as a spacer 220 illustrated in FIG. 2. For example, in a process for forming the pixel defining layer 538, the protrusion portion may be obtained through a process using a half tone mask or a process using photoresist that has a different thickness. In example embodiments, a height from an upper surface of the substrate 200 to an upper surface of the protrusion portion may be the same as a height from an upper surface of the substrate 200 to an upper surface of the second support pattern 232. The pixel defining layer 538 may include organic materials or inorganic materials. In example embodiments, the pixel defining layer 538 may include a siloxane-based resin.

Figure 5:
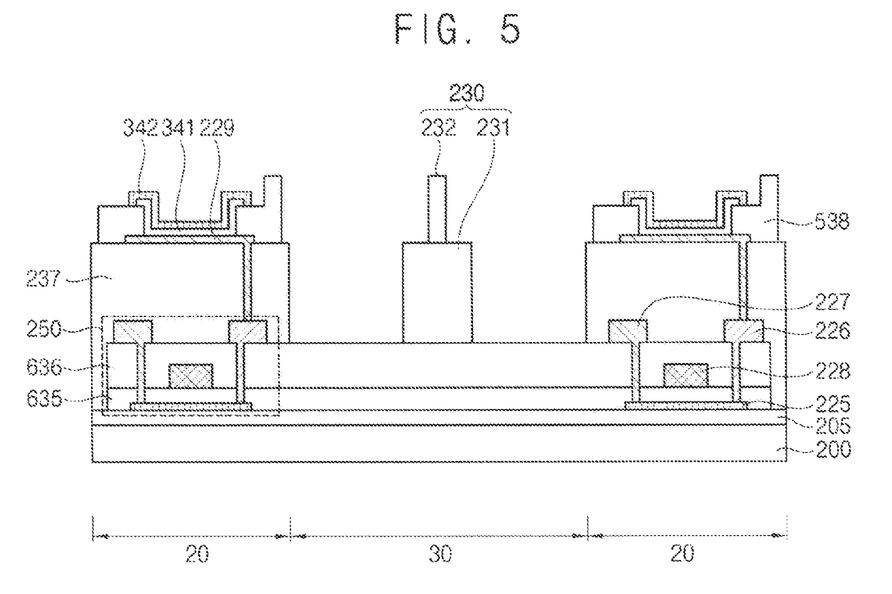
FIG. 5 is a cross-sectional view illustrating a display device, e.g., an OLED device, in accordance with example embodiments.

FIG. 5 is a cross-sectional view illustrating a display device, e.g., an OLED device, in accordance with example embodiments. An OLED device illustrated in FIG. 5 may have a configuration substantially the same as or similar to that of an OLED device described with reference to FIG. 4 except a gate insulation layer 735 and an insulating interlayer 736. In FIG. 5, detailed descriptions for elements that are substantially the same as or similar to elements described with reference to FIG. 4 may not be repeated.

Referring to FIG. 5, an OLED device may include a substrate 200, a buffer layer 205, a semiconductor element 250, a gate insulation layer 735, an insulating interlayer 736, a planarization layer 237, a lower electrode 229, a light emitting layer 341, an upper electrode 342, a pixel defining layer 538, a support structure 230, etc. Here, the semiconductor element 250 may include an active layer 225, a gate electrode 228, a source electrode 227, and a drain electrode 226. In embodiments, the support structure 230 may include a first support pattern 231 and a second support pattern 232.

The gate insulation layer 735 may be disposed on the active layer 225. The gate insulation layer 735 may be disposed in the sub-pixel region 20 and the transparent region 30 on the substrate 200. The gate insulation layer 735 may cover the active layer 225 in the sub-pixel region 20, and may extend in a direction that is parallel to an upper surface of the substrate 200. For example, the gate insulation layer 735 may sufficiently cover the active layer 225, and may have a substantially even surface without a step around the active layer 225. The gate insulation layer 735 may include transparent organic materials or transparent inorganic materials.

The insulating interlayer 736 may be disposed on the gate electrode 228 and the gate insulation layer 735. The insulating interlayer 736 may be disposed in the sub-pixel region 20 and the transparent region 30 on the substrate 200. The insulating interlayer 736 may cover the gate electrode 228 in the sub-pixel region 20, and may extend in a direction that is parallel to an upper surface of the substrate 200. For example, the insulating interlayer 736 may sufficiently cover the gate electrode 228, and may have a substantially even surface without a step around the gate electrode 228. The insulating interlayer 736 may include transparent organic materials or transparent inorganic materials.

Embodiments may be applied to various display devices. For example, embodiments may be applied to at least one of a vehicle-display device, a ship-display device, an aircraft-display device, portable communication devices, display devices for information transfer, a medical-display device, etc.

Although example embodiments have been described, those skilled in the art will readily appreciate that many modifications are possible in the example embodiments without materially departing from the novel teachings and advantages of the embodiments. All such modifications are intended to be included within the scope defined in the claims.

What is claimed is:

1. A display device comprising:
   a substrate;
   a first light emitting structure, which comprises a first electrode and a first light emitting layer, wherein a first face of the first electrode directly contacts the first light emitting layer and overlaps the substrate;
   a second light emitting structure, which comprises a second electrode and a second light emitting layer, wherein a face of the second electrode directly contacts the second light emitting layer and overlaps the substrate; and
   a support structure, which is positioned between the first light emitting structure and the second light emitting structure, is spaced from each of the first light emitting structure and the second light emitting structure, overlaps a transparent portion of the substrate, and does not include or directly contact any light emitting layer, wherein a maximum height of the support structure relative to the substrate is greater than at least one of a maximum height of the first face of the first electrode relative to the substrate and a maximum height of the first light emitting layer relative to the substrate.

2. The display device of claim 1, wherein a maximum width of the support structure in a direction parallel to the first face of the first electrode is less than a maximum width of the first face of the first electrode.

3. The display device of claim 1 comprising: a planarization layer, which is spaced from the support structure, is positioned between the substrate and the first light emitting structure, and directly contacts a second face of the first electrode, wherein the second face of the first electrode is opposite the first face of the first electrode, and wherein a material of the planarization layer is identical to a material of the support structure.

4. The display device of claim 3, wherein the support structure comprises a first support member and a second support member, wherein the first support member is positioned between the substrate and the second support member, wherein a maximum width of the first support member in a direction parallel to the first face of the first electrode is greater than a maximum width of the second support member in the direction parallel to the first face of the first electrode, and wherein a maximum height of the first support member relative to the substrate is equal to a maximum height of the planarization layer relative to the substrate.

5. The display device of claim 3, wherein the support structure and the planarization layer both directly contact the substrate or both directly contact a material layer that is positioned between the substrate and the support structure.

6. The display device of claim 3 comprising:
   a switching element, which is electrically connected to the first light emitting structure; and
   an intermediary layer, which is positioned between the substrate and the first light emitting structure, directly contacts at least one of the substrate and the switching element, and directly contacts both the support structure and the planarization layer.

7. The display device of claim 6, wherein the switching element comprises an active layer, wherein the intermediary layer directly contacts all of the active layer, the support structure, and the planarization layer.

8. The display device of claim 6, wherein the switching element comprises a drain electrode, wherein the drain electrode is directly connected to the first electrode, and wherein the intermediary layer directly contacts all of the drain electrode, the support structure, and the planarization layer.

9. The display device of claim 6, wherein the planarization layer directly contacts more faces of the intermediary layer than the support structure.

10. The display device of claim 1 comprising: a spacer, which is positioned between the first light emitting structure and the support structure, is spaced from each of the first light emitting structure and the support structure, is positioned closer to the first light emitting structure than to the support structure, and is shorter than the support structure in a direction perpendicular to the first face of the first electrode, wherein a maximum height of the spacer relative to the substrate is greater than at least one of the maximum height of the first face of the first electrode relative to the substrate and the maximum height of the first light emitting layer relative to the substrate.

11. The display device of claim 10, wherein the maximum height of the spacer relative to the substrate is equal to the maximum height of the support structure relative to the substrate.

12. The display device of claim 1 comprising: a pixel defining layer, which is spaced from the support structure, wherein a portion of the first light emitting layer is positioned between two portions of the pixel defining layer and directly contacts each of the two portions of the pixel defining layer, and wherein a maximum height of the pixel defining layer relative to the substrate is equal to the maximum height of the support structure relative to the substrate.

13. The display device of claim 1 comprising: a pixel defining layer, which is spaced from the support structure, wherein a portion of the first light emitting layer is positioned between two portions of the pixel defining layer and directly contacts each of the two portions of the pixel defining layer, wherein the support structure comprises a first support member and a second support member, wherein the first support member is positioned between the substrate and the second support member and is wider than the second support member in a direction parallel to the first face of the first electrode, wherein a material of the second support member is identical to a material of the pixel defining layer.

14. The display device of claim 1 comprising:
    a pixel defining layer, which is spaced from the support structure, wherein a portion of the first light emitting layer is positioned between two portions of the pixel defining layer and directly contacts each of the two portions of the pixel defining layer;
    a spacer, which protrudes from one of the two portions of the pixel defining layer and is narrower than each of the two portions of the pixel defining layer in a direction parallel to the first face of the first electrode, and wherein a maximum height of the spacer relative to the substrate is greater than at least one of the maximum height of the first face of the first electrode relative to the substrate and the maximum height of the first light emitting layer relative to the substrate.

15. The display device of claim 14, wherein the support structure comprises a first support member and a second support member, wherein the first support member is positioned between the substrate and the second support member and is wider than the second support member in the direction parallel to the first face of the first electrode, and wherein a maximum dimension of a combination of the spacer and the pixel defining layer in a direction perpendicular to the first face of the first electrode is equal to a maximum dimension of the second support member in the direction perpendicular to the first face of the first electrode.

16. The display device of claim 15, wherein a material of the second support member is identical to a material of the spacer.

17. The display device of claim 14, wherein the spacer and the light emitting layer directly contact a same face of the pixel defining layer.

18. The display device of claim 1, wherein the support structure includes siloxane-based material.

19. A display device comprising:
a substrate;
a light emitting structure, which comprises an electrode and a light emitting layer, wherein a face of the electrode directly contacts the light emitting layer and overlaps the substrate;
a pixel defining layer, wherein a portion of the light emitting layer is positioned between two portions of the pixel defining layer and directly contacts each of the two portions of the pixel defining layer; and
a spacer, which protrudes from one of the two portions of the pixel defining layer and is narrower than each of the two portions of the pixel defining layer in a direction parallel to the first face of the first electrode, and wherein a maximum height of the spacer relative to the substrate is greater than at least one of a maximum height of the face of the electrode relative to the substrate and a maximum height of the light emitting layer relative to the substrate.

20. The display device of claim 19 comprising: a support structure, which is spaced from the pixel defining layer, overlaps a transparent portion of the substrate, and comprises a first support member and a second support member, wherein the first support member is positioned between the substrate and the second support member and is wider than the second support member in a direction parallel to the face of the electrode, and wherein a minimum distance between the pixel defining layer and the substrate is equal to a minimum distance between the second support member and the substrate.

* * * * *